United States Patent [19]

Mizuno et al.

[11] Patent Number: 4,837,172

[45] Date of Patent: Jun. 6, 1989

[54] METHOD FOR REMOVING IMPURITIES EXISTING IN SEMICONDUCTOR SUBSTRATE

[75] Inventors: Bunji Mizuno, Ikoma; Masafumi Kubota, Osaka, both of Japan

[73] Assignee: Matsushita Electric Industrial Co., Ltd., Osaka, Japan

[21] Appl. No.: 73,829

[22] Filed: Jul. 15, 1987

[30] Foreign Application Priority Data

Jul. 18, 1986 [JP] Japan .................................. 61-170023
Apr. 28, 1987 [JP] Japan .................................. 62-105123

[51] Int. Cl.$^4$ .................... H01L 21/265; H01L 21/322
[52] U.S. Cl. ......................................... 437/011; 437/24
[58] Field of Search .................................. 437/11, 24; 148/DIG. 60, DIG. 61

[56] References Cited

U.S. PATENT DOCUMENTS

| | | | |
|---|---|---|---|
| 3,830,668 | 8/1974 | Dearnaley et al. | 437/11 |
| 3,865,633 | 2/1975 | Shannon et al. | 437/11 |
| 4,069,068 | 1/1978 | Beyer et al. | 437/11 |
| 4,358,323 | 11/1982 | Wallace | 437/11 |
| 4,579,600 | 4/1986 | Shah et al. | 437/31 |
| 4,704,302 | 11/1987 | Bruel et al. | 437/240 |

FOREIGN PATENT DOCUMENTS

| | | | |
|---|---|---|---|
| 0044170 | 4/1978 | Japan | 437/21 |
| 0020671 | 2/1979 | Japan | 437/11 |

OTHER PUBLICATIONS

Omura et al., VLSI Symposium, pp. 24-25, Kobe, Japan (1985).
Hemment, Mat. Res. Soc. Symp. Proc., vol. 33, p. 41 (1984).
Mao et al., Appl. Phys. Lett. 48(12), p. 794 (Mar. 24, 1986).
Foster et al., IEEE Trans. Elect. Dev., vol. ED33(3), p. 354 (1986).
Matsushita et al., Extended Abstract of the 18th (1986 International) Conference on Solid State Devices and Materials, pp. 529-532, Tokyo (1986).
Hampel et al. (Ed.), *The Encyclopedia of Chemistry* (3 Ed.), Van Nostrand Reinhold (1973), pp. 544-545.

*Primary Examiner*—Olik Chaudhuri
*Attorney, Agent, or Firm*—Wenderoth, Lind & Ponack

[57] ABSTRACT

A large quantity of oxygen ($10^{18}$ cm$^{-3}$) is dissolved in a semiconductor, for example, a silicon crystal substrate. In particular, in the SOI technology for forming a buried oxide film in silicon by oxygen ion implantation, a large quantity of oxygen (up to $10^{20}$ cm$^{-3}$) is left over in the silicon top layer. Such oxygen in the silicon becomes fine precipitates (defects) by the subsequent heat treatment step. Disclosed is, hence, a method for obtaining a semiconductor substrate of high quality by removing impurities by implanting ions containing light element (for example, hydrogen) before heat treatment.

4 Claims, 6 Drawing Sheets

METHOD FOR REMOVING IMPURITIES EXISTING IN SEMICONDUCTOR SUBSTRATE

BACKGROUND OF THE INVENTION

This invention relates to a method for removing impurities from a semiconductor substrate, and more particularly to a method for removing residual impurities existing in a surface silicon layer made of part of a silicon-on-insulator (SOI) substrate formed by ion implantation and a method for removing oxygen impurities existing in a silicon substrate.

(A) For example, the technology of SIMOX (Separation by Implanted Oxygen) for fabricating an SOI structure by implanting oxygen ions and making up a semiconductor device in this structure is explained below while referring to FIGS. 5 and 6. As shown in FIG. 5A, on the (100) plane 2A of silicon single crystal 2, $^{16}O^+$ beam 4 is implanted by $1 \times 10^{18}$ ions/cm$^2$ with an energy of 80 keV, and it is annealed at 1150° C. in a nitrogen atmosphere to form a buried insulator 6. Part 2B is a portion left over in the upper layer of the single crystal 2. Afterwards, As shown in FIG. 5B, an epitaxial layer 28 of about 1 μm is laminated, and a specified semiconductor device 16 is formed on this layer 28 as shown in FIG. 5C (Y. Omura et al., VLSI Symposium, Kobe, 1985, 24-25). Numeral 18 is a LOCOS partly oxidized from 2B and 28, 26 is a gate electrode, 20, 22 are source and drain electrodes, and 24 is a gate insulator. The SOI substrate formed in this method is composed of, when the surface epitaxial layer 28 is removed actually in FIG. 5B, Si top layer b, layer 10 containing much oxygen as impurities due to radiation damage, and SiO$_2$ layer 6 of correct composition ratio, sequentially from the surface side, as shown in FIG. 6 (P.L.F. Hewnent; Mat. Res. Soc. Symp. Proc., vol. 33, 1984, 41).

(B) Incidentally, when $^{16}O^+$ beam is implanted by $2.25 \times 10^{18}$ ions/cm$^2$ with an energy of 150 keV and the wafer is annealed at 1250° C. or higher temperature in a nitrogen atmosphere, the impurity oxygen in the silicon single crystal layer of the surface side is almost completely eliminated, and a steep interface is obtained (according to Mao et al., Appl. Phys. Lett., 48 (12), 24 Mar. 1986, 794).

(C) An attempt to modify the silicon surface by using hydrogen has been effected by annealing for 10 minutes at 950° C. or higher temperature in Hz atmosphere (Y. Matsushita et al., Extended Abstracts of the 18th 1986 International Conference on Solid State Devices and Materials, Tokyo, 1986 pp. 529-532). According to this example, after annealing the silicon single crystal at 850° C. to 1150° C. in H$_2$ atmosphere, it is further annealed at 1100° C. for 16 hours in O$_2$ atmosphere to induce defects, and the defects on the silicon surface are evaluated by Wright etching. When annealed at 950° C. or higher temperature, there is almost no defect formed on the surface, and the dielectric strength of capacitors fabricated on these substrates are also enhanced from 950° C. border line. This reason is that the oxygen concentration on the surface is lowered by H$_2$ annealing.

In the conventional method (A), due to the radiation damage occurring at the time of ion implantation, a wide damaged layer 10 is left over, as shown in FIG. 5C, between the surface side silicon single crystal layer 28 and the SiO$_2$ layer 6, and this layer 10 degrades the steepness of the Si-SiO$_2$ interface, which may become a route of leakage current when a semiconductor device is formed on the surface silicon single crystal layer 28. Besides, the oxygen impurities left over in the silicon top layer 28 become a donor in the subsequent manufacturing process to give influences, such as fluctuations of threshold voltage of MOS transistor (David J. Foster et al., IEEE Trans. Ele. Dev., vol. ED33 (3), 1986, 354).

In the conventional method (B), since an abnormally high temperature treatment is needed in the semiconductor process exceeding 1250° C., contamination by heavy metals from the annealing furnace materials may pose a serious problem.

In the high temperature annealing method in H$_z$ atmosphere in the conventional method (C), since pure hydrogen gas is used at a high temperature exceeding 850° C., the risk is very high, and an apparatus particularly considered in his respect, such as furnace for epitaxial growth is necessary. Besides, because of thermal diffusion, it is hard to control the concentration, depth and other factors accurately, and it is hence difficult to obtain a low silicon defect layer in a desired range.

SUMMARY OF THE INVENTION

To solve the above problems, this invention is intended to remove the impurities in the semiconductor substrate, by implanting ions containing light elements (such as hydrogen and helium) with a specified energy, and then annealing.

While the novel features of the invention are set forth with particularly in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1A:
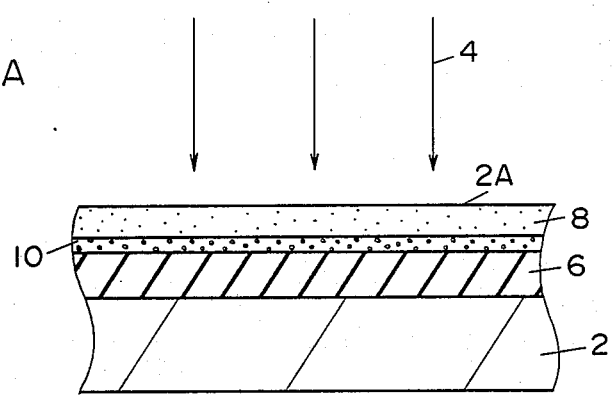
FIGS. 1A-1C, 3A-3C, and 4A-4D are sectional process diagrams showing a method of fabrication of semiconductor devices according to one of the embodiments of this invention.

Referring now to FIG. 1, a method of one of the embodiments of this invention is described below wherein hydrogen ions are implanted after implanting oxygen ions into the silicon substrate (100) plane. In FIG. 1A, the (100) surface 2A of a silicon substrate 2 is irradiated with an oxygen ion beam 4 with an energy of, for example, 180 keV, and a buried oxide layer 6 is formed in said silicon substrate 2. Because of oxygen ion (4) implantation, layer 10, which contains radiation damage and oxygen, is formed between Si top layer 8 and buried oxide layer 6. In Si to layer 8, oxygen is left over as shown by dot in such manner that it exceeds the solubility limit. Such residual oxygen may form precipitates as a result of the subsequent high temperature treatment, or cause dislocation accompanying formation of precipitates. Such precipitate or dislocation may become the capturing center of impurities or generation-recombination center of carrier, and is harmful as the SOI substrate, and ,the undesired oxygen must be removed.

Figure 1B:
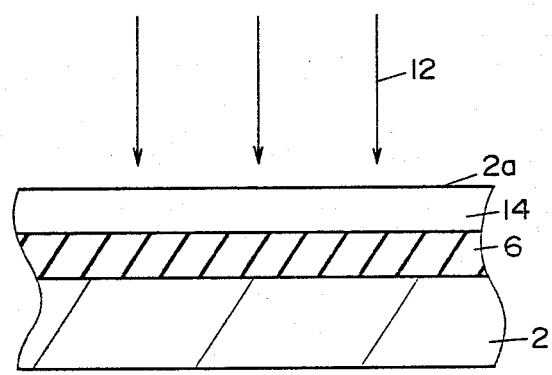

Accordingly, the substrate in FIG. 1A was kept at a high temperature from 300° C. as shown in FIG. 1B, for example, at 600° C., and a hydrogen ion beam 12, as light element ion, was implanted at a dose of $10^{15}$ to $10^{18}$ ions/cm$^2$ for example, $1.2 \times 10^{17}$ ions/cm$^2$, with an energy of, for example, 12 keV, and this substrate was annealed at a range of 1100° to 1200° C., for example, 1150° C., when a silicon top layer 14 of low oxygen concentration was obtained. That is, the layers 10, 8 become a silicon top layer 14 of low oxygen concentration.

Figure 2A:
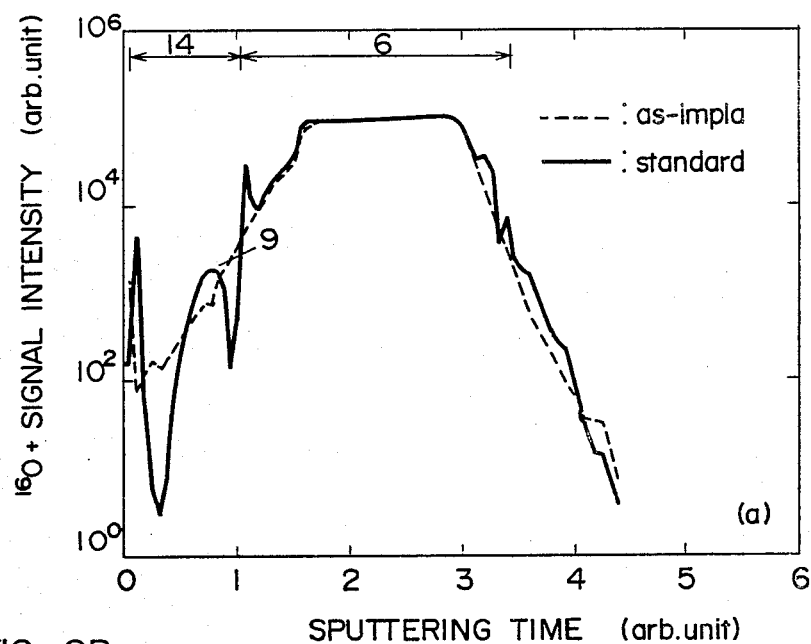
FIG. 2 is a characteristic diagram to show the oxygen concentration distribution in the silicon substrate.
Figure 2B:
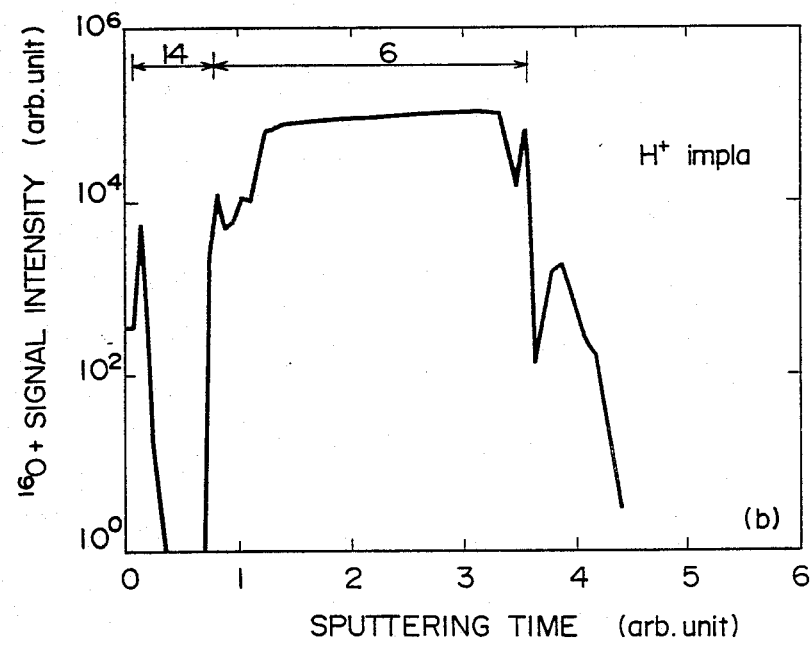

FIG. 2 is the measurement of oxygen concentration in that silicon substrate by SIMS (Secondary Ion Mass Spectroscopy). The axis of abscissas refers to the sputtering time with primary ion $^{133}$Cs$^+$, while the axis of ordinates denotes the signal intensity of secondary ion ($^{16}$O$^+$), and the both units are arbitrary. The broken line in FIG. 2A is an as-implanted profile of oxygen ions by $1.8 \times 10^{18}$ cm$^2$ with 180 keV. The solid line represents a conventional example of merely annealed at 1150° C., having a hump 9 of oxygen concentration in the surface silicon part 14. The solid line in FIG. 2B relates to an embodiment of this invention, in which the hump 9 has disappeared. In this case, the oxygen dose is $2.5 \times 10^{18}$ cm$^{-2}$.

Figure 1C:
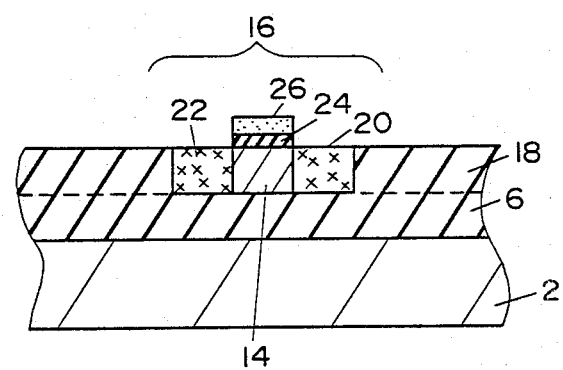

In the surface silicon layer 14 of thus treated silicon substrate, for example, a MOS transistor 16 is formed as shown in FIG. 1C. In this drawing, numeral 18 is a peripheral separated oxide, 20, 22 are source, drain electrodes, 24 is a gate insulator, and 26 is a gate electrode, hydrogen molecule ion or helium ion is used as light element ion.

At 1150° C., meanwhile, the diffusion constant of oxygen in Si is $4 \times 10^{-10}$ cm$^2$s$^{-1}$, and when merely heated at 1150° C., it is diffused very rapidly at this temperature. However, since the oxygen concentration contained in the Si top layer of the SOI formed by oxygen ion implantation is very high (over $10^{20}$ oxygen/cm$^3$), the speed of precipitation into SiO$_2$ is very high, and the oxygen in Si is diffused toward the SiO$_2$ diffusion nucleus. Therefore, much SiO$_2$ precipitate is left over in the silicon top layer. But precipitation of residual oxygen does not occur if hydrogen ion is implanted as in this invention. If the effect of hydrogen is only to accelerate the diffusion of oxygen, the formation of precipitate is only promoted. That is, the implanted hydrogen completely restricts the oxygen in the Si top layer will precipitating as SiO$_2$ in the Si top layer. Accordingly, oxygen is diffused outward or in the direction of buried oxide layer 6, so that an SOI substrate having the silicon top layer free from oxide precipitate and buried insulator layer contacting each other on a steep interface may be obtained. When forming a MOS transistor on thus formed SOI substrate, the diffusion layer of source, drain electrodes can be lowered to the interface, and it is possible to realize a structure making the most of the original feature of the SOI structure, that is, reduction of floating capacity, which may contribute to fabrication of high performance SOI type semiconductor device.

Figure 3A:
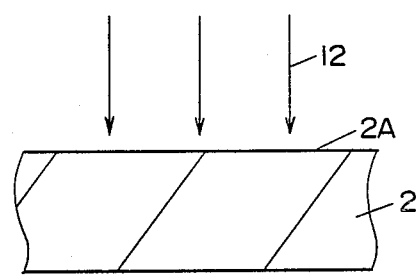
Figure 3B:
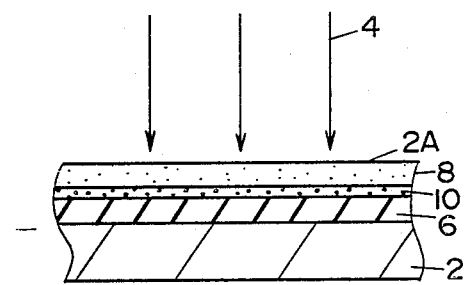

FIG. 3 shows a different embodiment of this invention, in which oxygen ions are implanted after implanting hydrogen ions in the silicon substrate (100) plane. As shown in FIG. 3B, the (100) surface 2A of a silicon substrate 2 is irradiated with an oxygen ion beam 4 with an energy of, for example, 180 keV to form a buried oxide layer 6 on said silicon substrate. At this time, radiation damage is formed between the silicon layer 8 and oxide layer 6 left over on the surface according to the ion implantation distribution, and a layer 10 containing much oxygen is formed, so that oxygen at a concentration over the solubility limit is left over in the surface silicon layer 8. Such residual oxygen may form precipitates due to the subsequent high temperature heat treatment, or induce occurrence of dislocation accompanying formation of precipitates. Such precipitate or dislocation may be the capturing center of impurities or generation-recombination center of carrier, and is harmful as SOI substrate, and it is necessary to remove undesired oxygen.

Incidentally, hydrogen ions are preliminarily implanted as shown in FIG. 3A. The silicon substrate 2 is kept at a high temperature somewhere between ordinary temperature and about 800° C., for example, 400° C., and hydrogen ion beam 12, as light element ion, is implanted at a dose ranging from $10^{15}$ to $10^{18}$ ions/cm$^2$, for example, $1.2 \times 10^{17}$ ions/cm$^2$, with an energy of, for example, 12 keV. Afterwards, as shown in FIG. 3B, oxygen ion beam 4 is bombarded with an energy of, for example, 180 keV, and a buried oxide layer 6 is formed. When this sample is annealed in a range of 800° C. to 1200° C., for example, 1150° C., in Nz atmosphere, the depth distribution of oxygen concentration in this silicon substrate is same as indicated by the solid line in FIG. 2 of the preceding embodiment, which suggests that the oxygen concentration in the surface Si layer 14 is lowered.

Figure 3C:
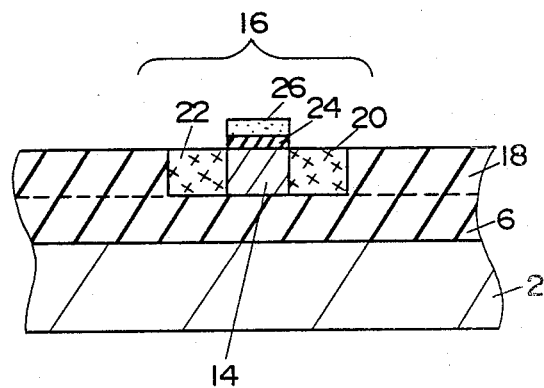
Figure 4A:
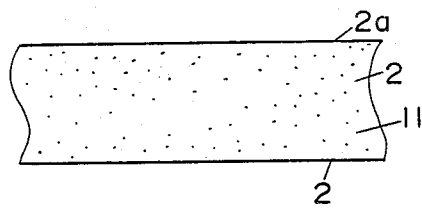
Figure 4B:
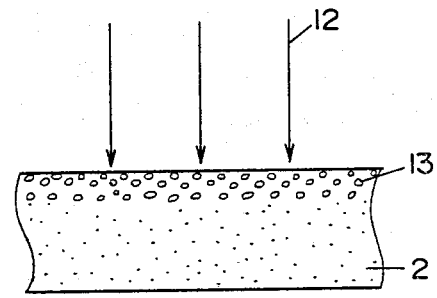
Figure 4C:
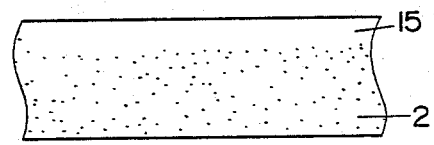
Figure 4D:
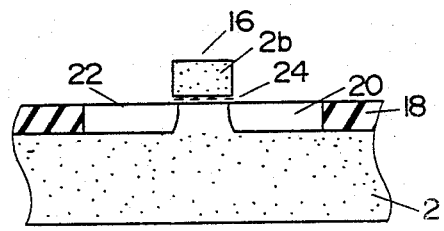
Figure 5A:
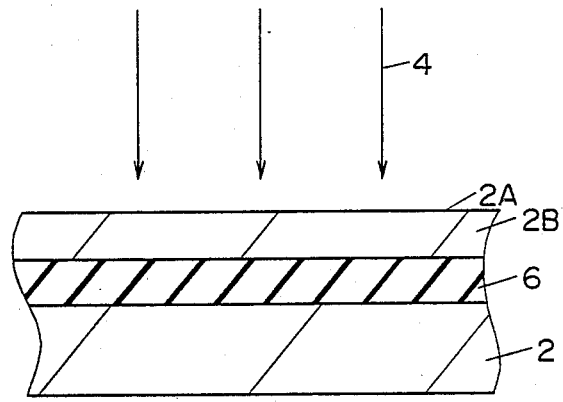
FIG. 5, 6 are sectional views to indicate the prior art.
Figure 5B:
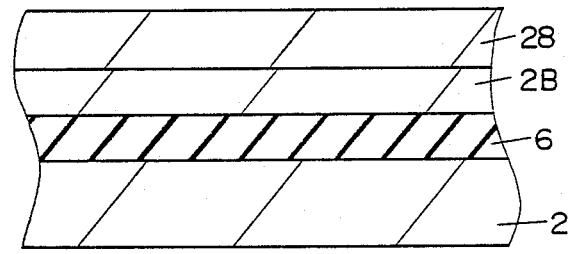
Figure 5C:
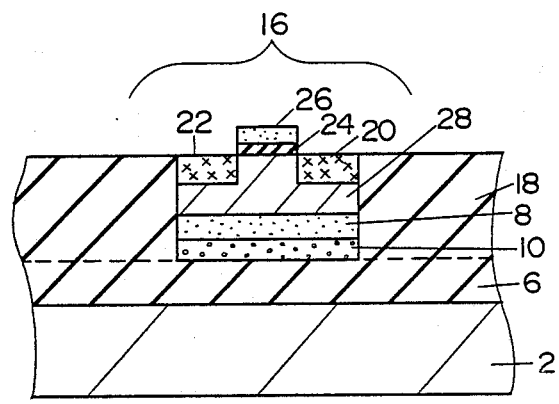
Figure 6:
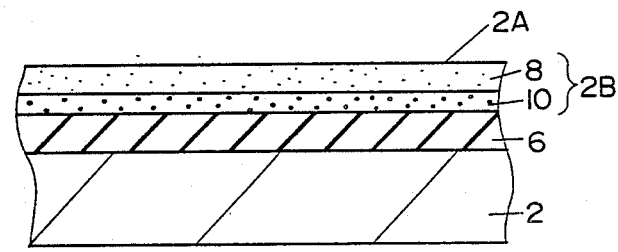

In the surface silicon layer 14 of thus treated silicon substrate, for example, a MOS transistor 16 is formed as shown in FIG. 3C, in which numeral 18 is a peripheral separated oxide, 20, 22 are source, drain electrodes, 24 is a gate insulator, and 26 is a gate electrode. Similar effects will be obtained, incidentally, when hydrogen molecule ion or helium ion is used as light element ion. The action of hydrogen on the oxygen in Si is same as in the first embodiment, and the obtained effect is the same, too.

A further different embodiment of this invention is described below while referring to FIG. 4, in which a silicon substrate (100) plane is annealed in nitrogen atmosphere after implanting hydrogen ions. In the drawing, numeral 2 is a silicon single crystal formed by the Czochrllski method or the like, and it contains, as impurities, a high concentration of oxygen (for example, $1 \times 10^{18}$ oxygen/cm$^3$), and spots 11 indicate the contained oxygen. On the surface 2a of this silicon substrate 2, a hydrogen ion beam 12 is implanted at a dose more than the portion corresponding to the oxygen concentration contained in the silicon substrate 2 (for example, if $2 \times 10^{18}$ oxygen/cm$^2$, a dose of about $5 \times 10^{13}$ H$^+$/cm$^2$ or over in a range of, for example, 30 keV to 200 keV). As a result, as shown in FIG. 3B, a layer 13 containing hydrogen is formed. When this silicon substrate 2 is annealed for about 2 hours at, for example, 900° C. in nitrogen atmosphere, the oxygen contained in the layer 13 diffuses outward together with the implanted hydrogen, and a denuded zone for oxygen 15 is formed. Afterwards, a specified semiconductor device, for example, MOSFET 16 is formed on the surface 2a of the substrate 2. Numeral 26 is a gate electrode, 24 is a gate oxide, 20 is a source, 2 is a drain, and 18 is a peripheral oxide.

The implanted hydrogen chemically reduces the oxygen in Si, and physically cuts off the Si-0 bond by the implantation energy, thereby lowering the activation energy of diffusion of oxygen in Si and promoving the diffusion of oxygen outward from the surface. Therefore, the oxygen contained at high concentration in Si is lowered in the layer 13 in which hydrogen is implanted.

The oxygen contained in silicon single crystal becomes a nucleus of formation of lattice defect in various heat treatment steps in manufacturing process of semiconductor devices. The critical oxygen concentration for formation of defect is said to be about 1 to $5 \times 10^{17}$ $O/cm^3$ (M. Ogino, T. Usami, N. Watanabe, K. Sekine and T. Kawaguchi; submitted to the Journal of Electrochemical Society), and oxygen is contained by about 1 to $1.5 \times 10^{18}$ $O/cm^3$ or more in the silicon substrate the Czochralski method mainly employed in semiconductor process, which exceeds said critical concentration.

According to the method of this invention, the oxygen concentration of about several microns on the silicon substrate surface can be removed quite safely, and it contributes to fabrication of semiconductor devices of high dielectric strength and high reliability.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A method for making a silicon-on-insulator (SOI) structure having a buried oxide layer and silicon top layer thereon in a silicon substrate comprising steps of:
   (a) implanting hydrogen or hydrogen ions into a first region in said silicon substrate, which region is to be said silicon top layer;
   (b) implanting oxygen or ions which contain oxygen into a second region in said silicon substrate, which region is to be said buried oxide layer, thereby, residual oxygen remaining in said silicon top layer in this step (b);
   (c) annealing the structure of step (b); and
   (d) removing said residual oxygen from said silicon top layer.

2. A method for making a silicon-on-insulator (SOI) structure having a buried oxide layer and silicon top layer thereon in a silicon substrate comprising steps of:
   (a) implanting oxygen or ions which contain oxygen into a second region in said silicon substrate, which region is to be said buried oxide layer, thereby, residual oxygen remaining in said silicon top layer in this step (a);
   (b) implanting hydrogen or hydrogen ions into a first region in said silicon substrate, which region is to be said silicon top layer;
   (c) annealing the structure of step (b); and
   (d) removing said residual oxygen from said silicon top layer.

3. The method of claim 1, wherein said oxygen or ions which contain oxygen are implanted in the amount of at least $1 \times 10^{18}$ ions/$cm^2$.

4. The method of claim 2, wherein said oxygen or ions which contain oxygen are implanted in the amount of at least $1 \times 10^{18}$ ions/$cm^2$.

* * * * *